United States Patent
Kojima

(10) Patent No.: US 10,420,255 B2
(45) Date of Patent: Sep. 17, 2019

(54) ELECTRONIC CONTROL DEVICE

(71) Applicant: JTEKT CORPORATION, Osaka-shi (JP)

(72) Inventor: Yoshihiro Kojima, Okazaki (JP)

(73) Assignee: JTEKT CORPORATION, Osaka-shi (JP)

( * ) Notice: Subject to any disclaimer, the term of this patent is extended or adjusted under 35 U.S.C. 154(b) by 0 days.

(21) Appl. No.: 15/700,522

(22) Filed: Sep. 11, 2017

(65) Prior Publication Data

US 2018/0077825 A1 Mar. 15, 2018

(30) Foreign Application Priority Data

Sep. 14, 2016 (JP) .................................. 2016-179843
Sep. 23, 2016 (JP) .................................. 2016-186121

(51) Int. Cl.
*H05K 7/20* (2006.01)
*H01L 23/367* (2006.01)
(Continued)

(52) U.S. Cl.
CPC ......... *H05K 7/20909* (2013.01); *H01L 23/36* (2013.01); *H01L 23/3677* (2013.01); *H01L 23/42* (2013.01); *H05K 1/0206* (2013.01); *H01L 23/367* (2013.01); *H01L 23/3675* (2013.01); *H05K 1/114* (2013.01); *H05K 3/0061* (2013.01);
(Continued)

(58) Field of Classification Search
CPC .............................................. H05K 1/113–114
See application file for complete search history.

(56) References Cited

U.S. PATENT DOCUMENTS 5,258,887 A * 11/1993 Fortune ............... H01L 23/3736
174/252
5,339,519 A * 8/1994 Fortune ............... H01L 23/3736
174/16.3
(Continued)

FOREIGN PATENT DOCUMENTS

DE   27 41 320 A1   3/1979
EP   0 600 590 A1   6/1994
(Continued)

OTHER PUBLICATIONS

Extended European Search Report dated Feb. 20, 2018 in Patent Application No. 17190518.5.

*Primary Examiner* — Robert J Hoffberg
(74) *Attorney, Agent, or Firm* — Oblon, McClelland, Maier & Neustadt, L.L.P.

(57) ABSTRACT

An electronic control device includes a heating element, a circuit substrate, a heat radiation plate, and a heat radiation material. Connection terminals of the heating element are fixed to wiring patterns on a circuit principal surface of the circuit substrate with solder. Through holes are provided in the circuit substrate at portions spaced away from the distal ends of the connection terminals of the heating element by a distance equal to or smaller than a thickness of the circuit substrate. The heat radiation material applied between a circuit principal surface of the circuit substrate and the heat radiation plate is exposed to the circuit principal surface via the through holes. The heat radiation material exposed to the circuit principal surface covers the distal ends of the connection terminals fixed with the solder.

5 Claims, 3 Drawing Sheets

(51) Int. Cl.
  *H05K 1/11* (2006.01)
  *H01L 23/36* (2006.01)
  *H01L 23/42* (2006.01)
  *H05K 1/02* (2006.01)
  *H05K 3/00* (2006.01)

(52) U.S. Cl.
  CPC ............ *H05K 2201/0959* (2013.01); *H05K 2201/10166* (2013.01)

(56) References Cited

U.S. PATENT DOCUMENTS

| | | | | |
|---|---|---|---|---|
| 5,473,119 | A | * | 12/1995 | Rosenmayer ......... H01L 23/145 174/250 |
| 5,586,008 | A | * | 12/1996 | Kozel ................ H01R 12/7058 174/260 |
| 6,129,955 | A | * | 10/2000 | Papathomas ........... H05K 3/284 427/517 |
| 6,188,578 | B1 | | 2/2001 | Lin et al. |
| 6,522,555 | B2 | * | 2/2003 | Hirano ................ H01L 23/3737 174/51 |
| 6,936,769 | B1 | * | 8/2005 | Noguchi ............ H01L 23/3677 174/260 |
| 8,334,591 | B2 | * | 12/2012 | Kusano ................ H01L 21/565 257/706 |
| 9,237,644 | B2 | * | 1/2016 | Stella ................ H05K 13/0465 |
| 9,253,925 | B1 | | 2/2016 | Smith |
| 9,615,444 | B2 | * | 4/2017 | Stella ................ H05K 1/0204 |
| 2004/0136162 | A1 | * | 7/2004 | Asai .................... H05K 1/0207 361/715 |
| 2004/0233642 | A1 | | 11/2004 | Ito et al. |
| 2004/0238211 | A1 | * | 12/2004 | Momokawa ......... H05K 1/0201 174/260 |
| 2005/0063162 | A1 | | 3/2005 | Barcley |
| 2007/0176294 | A1 | * | 8/2007 | Wada ................ H01L 23/49816 257/774 |
| 2009/0194322 | A1 | * | 8/2009 | Usui ..................... H05K 1/115 174/260 |
| 2011/0290545 | A1 | * | 12/2011 | Wada ................ H01L 23/49816 174/258 |
| 2015/0173169 | A1 | | 6/2015 | Zhang et al. |
| 2017/0318661 | A1 | * | 11/2017 | Matsunaga ......... H01L 23/3675 |

FOREIGN PATENT DOCUMENTS

| | | |
|---|---|---|
| EP | 2 884 530 A2 | 6/2015 |
| JP | 2006-54481 A | 2/2006 |
| JP | 2011-165903 A | 8/2011 |
| JP | 2014-135418 | 7/2014 |
| JP | 2015-135852 | 7/2015 |

* cited by examiner

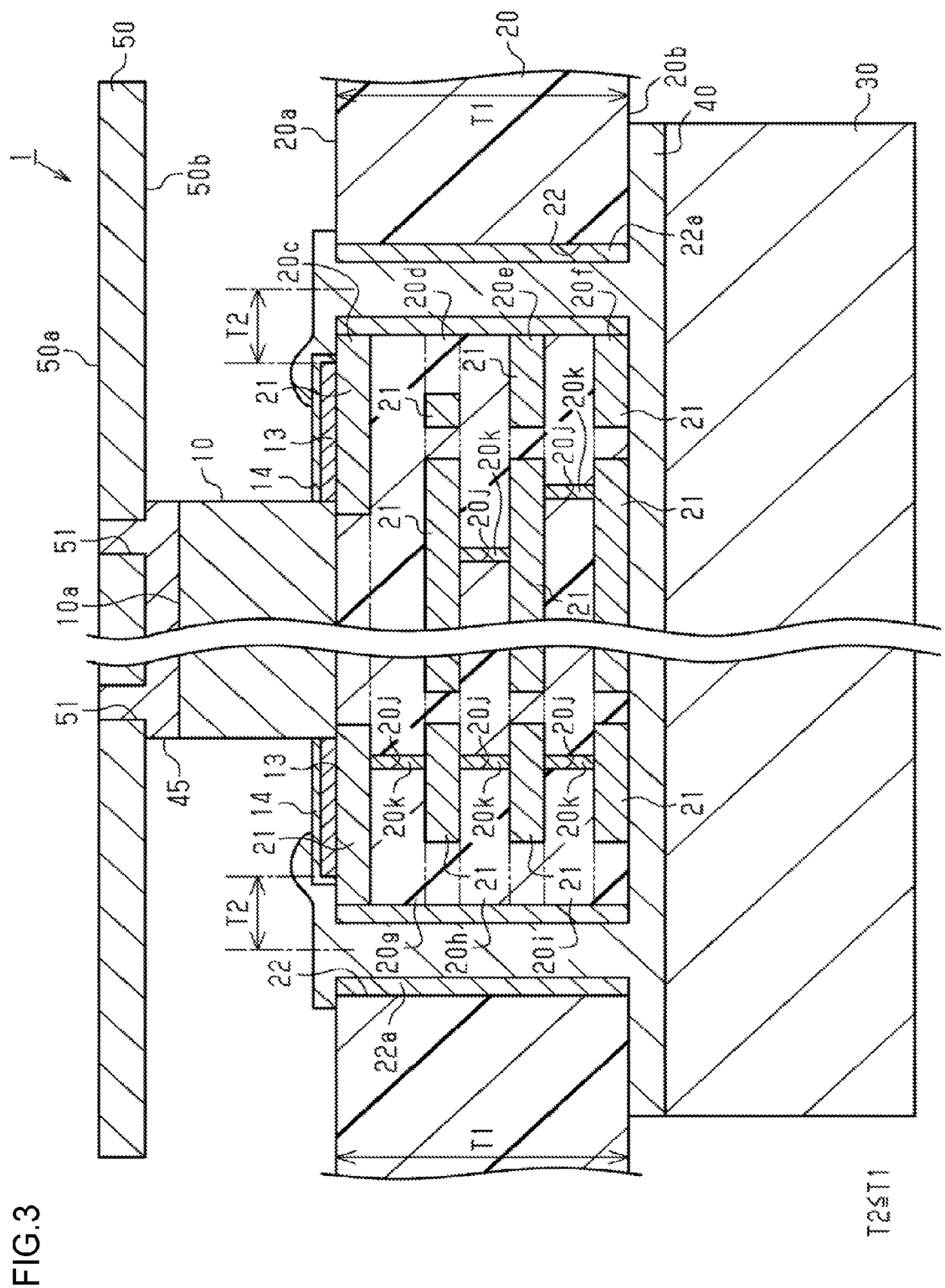

ELECTRONIC CONTROL DEVICE

INCORPORATION BY REFERENCE

The disclosures of Japanese Patent Applications No. 2016-179843 and No. 2016-186121 respectively filed on Sep. 14, 2016 and Sep. 23, 2016, each including the specification, drawings and abstract, are incorporated herein by reference in their entireties.

BACKGROUND OF THE INVENTION

1. Field of the Invention

The present invention relates to an electronic control device.

2. Description of the Related Art

Hitherto, as described in Japanese Patent Application Publication No. 2014-135418 (JP 2014-135418 A), there is known an on-board electronic control device including a substrate having a heating element mounted thereon, and a metal base serving as a first heat radiator, which is a heat radiation plate that supports the substrate.

The substrate has through vias passing through the substrate in its thickness direction and serving as heat transfer paths. The through vias are provided in the substrate at a position where the heating element is mounted. A projecting heat radiation member is provided on a surface of the substrate that is opposite to the portion where the heating element is mounted. The metal base is provided with a recess for inserting the projecting heat radiation member. A space between the heat radiation member and the recess of the metal base is filled with a heat radiation material serving as a second heat radiator. The heat radiation member and the metal base are thermally in contact with each other via the heat radiation material. With this structure, heat generated by the heating element is transferred to the metal base via the through vias of the substrate, the heat radiation member, and the heat radiation material.

As described in Japanese Patent Application Publication No. 2015-135852 (JP 2015-135852 A), there is known a semiconductor device in which a heat radiation plate serving as a first heat radiator is provided so as to face a surface of a substrate where a heating element is provided. The heat radiation plate and the heating element have a clearance therebetween, and a heat radiation material serving as a second heat radiator is provided so as to fill a part of the clearance. The heat radiation plate and the heating element are thermally in contact with each other via the heat radiation material. Heat generated by the heating element is transferred to the heat radiation plate via the heat radiation material.

In the structure described in JP 2014-135418 A, it is difficult to check whether the heat radiation material is appropriately filled in the space between the heat radiation member and the metal base when the substrate is mounted on the metal base. Also in the structure described in JP 2015-135852 A, it is difficult to check whether the heat radiation material is appropriately filled in the space between the heat radiation plate and the heating element when the heat radiation material is provided between the heat radiation plate and the heating element.

SUMMARY OF THE INVENTION

It is one object of the present invention to provide an electronic control device that allows a check on the condition of a second heat radiator interposed in at least one of a space between a substrate and a first heat radiator and a space between a heating element and the first heat radiator.

An electronic control device according to one aspect of the present invention includes a substrate provided with a heating element on one surface, a second heat radiator provided on at least one of the other surface of the substrate that is opposite to the one surface of the substrate and a surface of the heating element that is opposite to the substrate, and a first heat radiator provided such that the second heat radiator is interposed between the first heat radiator and the at least one of the other surface of the substrate and the surface of the heating element that is opposite to the substrate. When the second heat radiator is provided on the other surface of the substrate, the substrate has a through hole that passes through the substrate in its thickness direction and is provided away from peripheral edges of the heating element at a position where the second heat radiator is interposed. When the second heat radiator is provided on the surface of the heating element that is opposite to the substrate, the first heat radiator provided such that the second heat radiator is interposed between the first heat radiator and the heating element has a through hole that passes through the first heat radiator in its thickness direction and is provided within a range of a part of the first heat radiator that corresponds to the heating element.

In the structure described above, when the second heat radiator is provided on the other surface of the substrate, the condition of the second heat radiator provided between the other surface of the substrate and the first heat radiator can be checked via the through hole that passes through the substrate in its thickness direction and is provided in the substrate away from the peripheral edges of the heating element at the position where the second heat radiator is interposed. When the second heat radiator is provided on the surface of the heating element that is opposite to the substrate, the condition of the second heat radiator provided between the heating element and the first heat radiator that faces the heating element via the second heat radiator can be checked via the through hole that passes through the first heat radiator in its thickness direction and is provided in the first heat radiator within the range of the part of the first heat radiator that corresponds to the heating element.

In the electronic control device according to the aspect described above, the heating element may have a plurality of terminals on its peripheral edges, the substrate may have substrate electrodes, the terminals may be connected to the substrate electrodes with solder, and a part of the substrate electrodes may be exposed to an inside of the through hole of the substrate.

In the electronic control device according to the aspect described above, the second heat radiator enters the through hole to some extent when the second heat radiator is arranged between the other surface of the substrate and the first heat radiator. Therefore, heat generated from the heating element is transferred to the terminals, and is further transferred from the terminals to the second heat radiator in the through hole via the substrate electrodes of the substrate. Thus, the heat radiation effect for the heat generated from the heating element can further be improved.

In the electronic control device according to the aspect described above, when the second heat radiator is provided on the other surface of the substrate, the second heat radiator may be exposed to the one surface of the substrate via the through hole provided in the substrate.

In the electronic control device according to the aspect described above, the second heat radiator is exposed to the one surface of the substrate via the through hole of the substrate. The exposure of the second heat radiator to the one surface of the substrate via the through hole of the substrate indicates that the second heat radiator is sufficiently arranged between the substrate and the first heat radiator. Therefore, it is only necessary to check that the second heat radiator is exposed to the one surface of the substrate. Thus, it is possible to check more easily that the second heat radiator is appropriately arranged between the other surface of the substrate and the first heat radiator.

In the electronic control device according to the aspect described above, the heating element may have a plurality of terminals on its peripheral edges, the terminals may be connected, with solder, to substrate electrodes provided on the one surface of the substrate, and at least a part of the terminals may be covered with the second heat radiator exposed to the one surface of the substrate.

In the electronic control device according to the aspect described above, at least a part of the terminals of the heating element is covered with the second heat radiator exposed to the one surface of the substrate. Therefore, the heat generated from the heating element is directly transferred to the second heat radiator. Thus, the heat radiation effect for the heat generated from the heating element can further be improved.

In the electronic control device according to the aspect described above, the second heat radiator may have a curability and an insulating property.

In the electronic control device according to the aspect described above, the terminals of the heating element that are connected to the substrate electrodes with the solder are covered with the second heat radiator exposed to the one surface of the substrate. The second heat radiator has the curability, and therefore the maintainability of connection of the terminals of the heating element to the substrate electrodes can be improved. The second heat radiator has the insulating property, and therefore the insulation between the adjacent terminals can also be improved.

In the electronic control device according to the aspect described above, when the second heat radiator is provided on the surface of the heating element that is opposite to the substrate, the second heat radiator provided on the surface of the heating element that is opposite to the substrate may be exposed to an outside via the through hole of the first heat radiator provided such that the second heat radiator is interposed between the first heat radiator and the heating element.

In the structure described above, the second heat radiator is exposed to the outside via the through hole of the first heat radiator provided on a side of the surface of the heating element that is opposite to the substrate. The exposure of the second heat radiator to the outside via the through hole of the first heat radiator provided opposite to the substrate across the heating element indicates that the second heat radiator is sufficiently interposed between the heating element and the first heat radiator. Therefore, it is only necessary to check that the second heat radiator is exposed to the outside. Thus, it is possible to check more easily that the second heat radiator is appropriately interposed between the heating element and the first heat radiator.

In the electronic control device according to the aspect described above, it is possible to check the condition of the second heat radiator interposed in at least one of the space between the substrate and the first heat radiator and the space between the heating element and the first heat radiator.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 3 is a sectional view illustrating the sectional structure of an electronic control device according to a second embodiment.

DETAILED DESCRIPTION OF EMBODIMENTS

An electronic control device according to a first embodiment of the present invention is described below.

Figure 1:
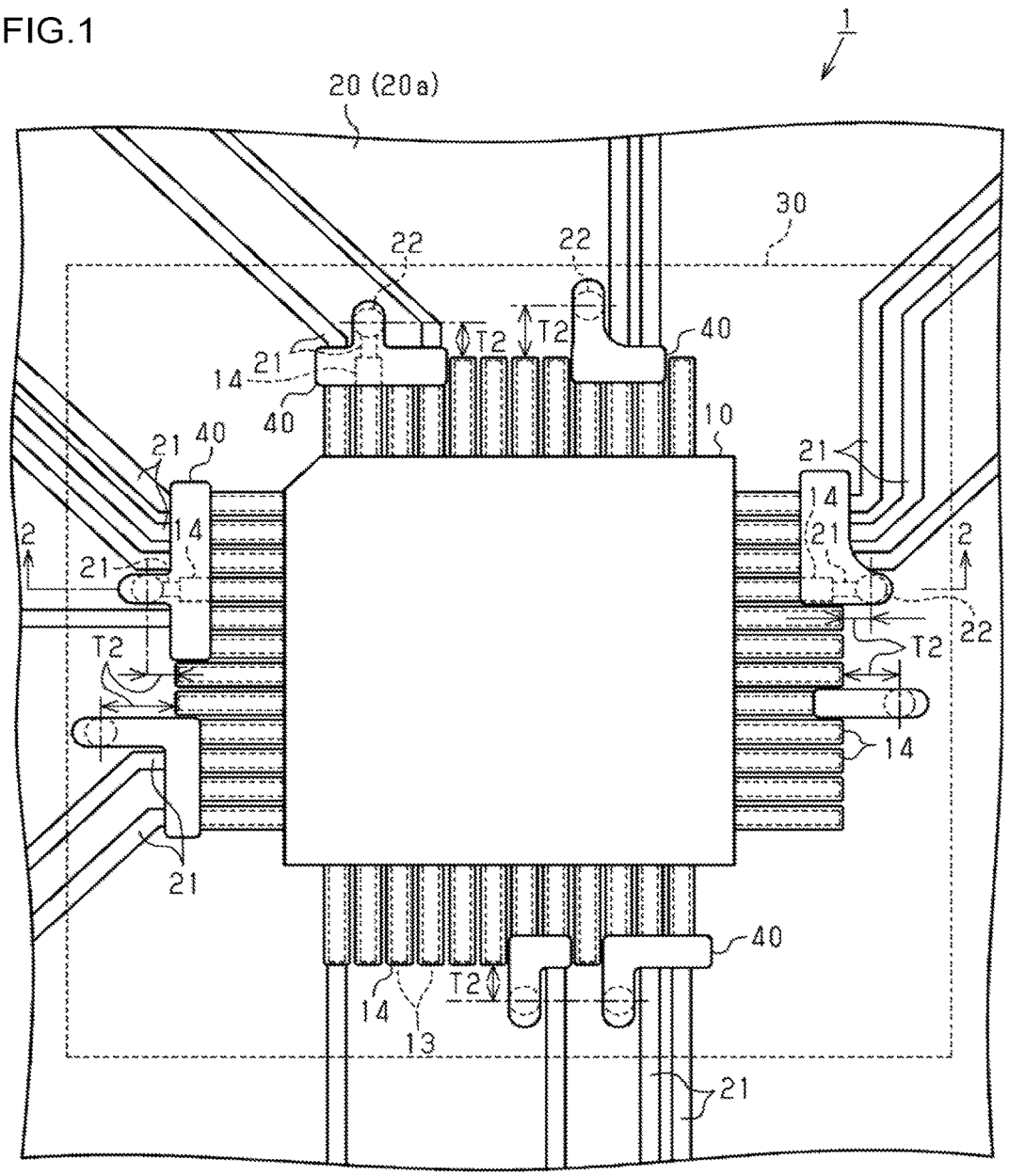
FIG. 1 is a partial plan view illustrating the vicinity of a heating element of an electronic control device according to one embodiment.

As illustrated in FIG. 1, an electronic control device 1 is used for controlling operation of, for example, a motor of an electric power steering system to be mounted on a vehicle. The electronic control device 1 includes a heating element 10, a rectangular plate-like circuit substrate 20, and a rectangular plate-like heat radiation plate 30 serving as a first heat radiator, which is indicated by an imaginary line.

The heating element 10 has a plurality of connection terminals 13. Examples of the heating element 10 include an integrated circuit (IC) and a field effect transistor (FET). The connection terminal 13 is fixed to the circuit substrate 20 with solder 14. The solder 14 covers the entire connection terminal 13. The heat radiation plate 30 is formed of a metal material having a high thermal conductivity, such as an aluminum alloy.

Figure 2:
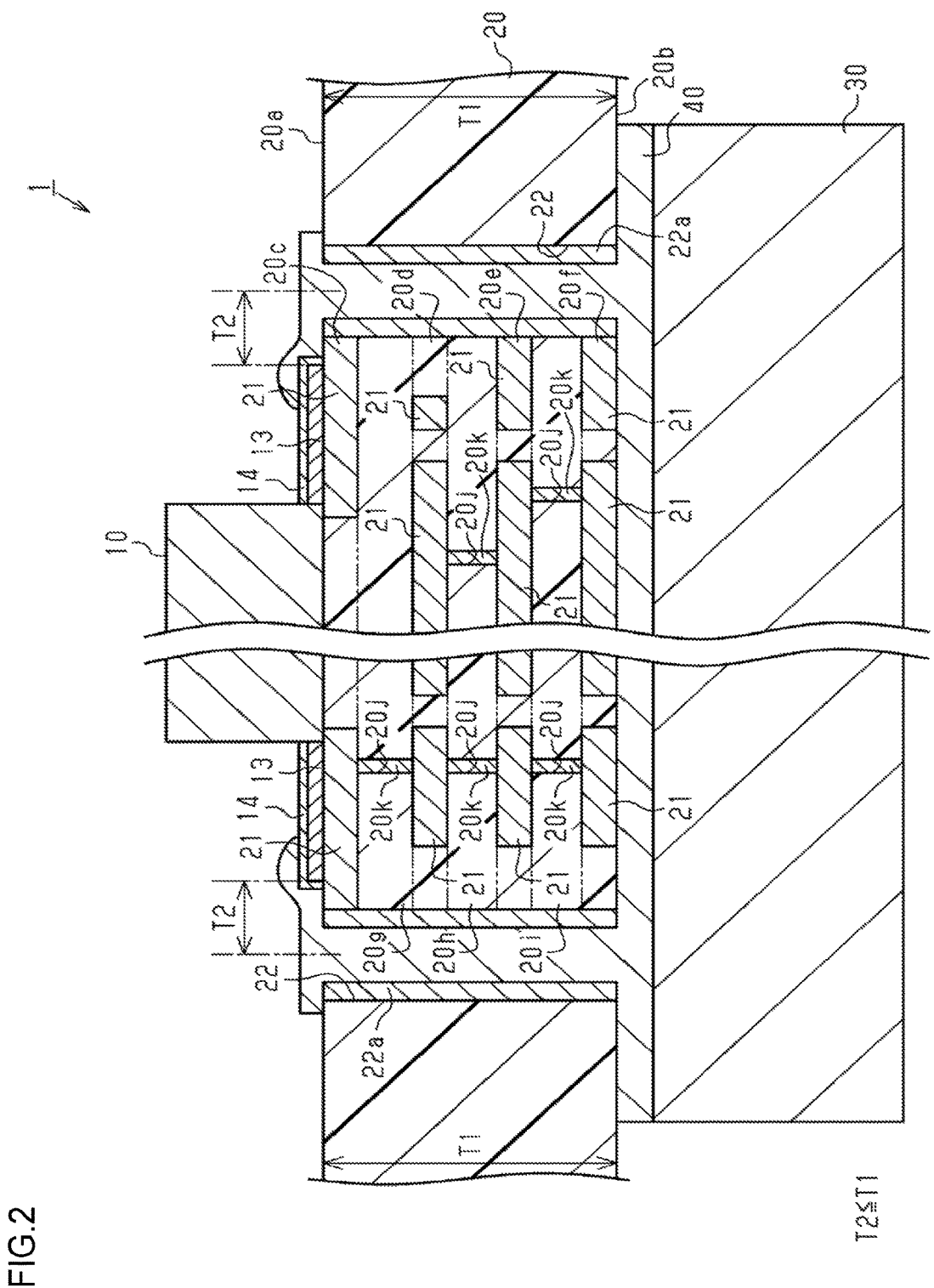
FIG. 2 is a sectional view illustrating the sectional structure of an electronic control device according to a first embodiment.

As illustrated in FIG. 2, the circuit substrate 20 has a circuit principal surface 20a as one surface, and a circuit principal surface 20b as the other surface. In the electronic control device 1, the heat radiation plate 30 is provided so as to face the circuit principal surface 20b of the circuit substrate 20, and the heating element 10 is provided on the circuit principal surface 20a of the circuit substrate 20. The circuit substrate 20 has a predetermined thickness T1. The circuit substrate 20 has a multilayer structure in which first to fourth circuit conductor layers 20c to 20f are laminated with first to third insulating layers 20g to 20i respectively interposed therebetween. Specifically, the circuit substrate 20 is formed by laminating the first circuit conductor layer 20c, the first insulating layer 20g, the second circuit conductor layer 20d, the second insulating layer 20h, the third circuit conductor layer 20e, the third insulating layer 20i, and the fourth circuit conductor layer 20f in the order from the heating element 10 side. Each of the first to fourth circuit conductor layers 20c to 20f has wiring patterns 21 serving as substrate electrodes, which are formed by removing a part of conductive foil such as copper foil by etching or the like. A clearance between the wiring patterns 21 formed in each of the second and third circuit conductor layers 20d and 20e is filled with an insulating resin material. Each of the first to third insulating layers 20g to 20i is formed of an insulating resin material to maintain insulation between the wiring patterns 21 adjacent to each other in a direction orthogonal to the circuit substrate 20. The circuit substrate 20 has a plurality of via holes (interlayer connection holes) 20j passing through predetermined circuit conductor layers and insulating layers and extending in a laminating direction (vertical direction in FIG. 2). A connection member 20k formed of a conductive material such as copper is inserted into the via hole 20j. The wiring patterns 21 of different layers are electrically connected to each other via the connection member 20k. The circuit substrate 20 has a plurality of cylindrical through holes 22. The through hole 22 passes through the circuit substrate 20 in its thickness direction. The through hole 22 is open to each of the circuit principal surface 20a and the circuit principal surface 20b. The through hole 22 has its inner peripheral surface coated with conductive plating 22a such as copper foil. The conductive plating 22a provided on the inner peripheral surface of the through hole 22 is in contact with predetermined wiring patterns 21 of the first to fourth circuit conductor layers 20c to 20f.

As illustrated in FIG. 1, the circuit substrate 20 has eight through holes 22. The through holes 22 are arranged away from the distal ends of the connection terminals 13 of the heating element 10 (peripheral edges of the heating element 10) by a distance T2 equal to or smaller than the substrate thickness T1. The through holes 22 are arranged with intervals over the entire periphery of the heating element 10. Specifically, two through holes 22 are arranged on each side of the heating element 10 correspondingly.

As illustrated in FIG. 2, a heat radiation material 40 is applied between the circuit principal surface 20b of the circuit substrate 20 and the heat radiation plate 30. Further, the heat radiation material 40 is filled in the through holes 22. The heat radiation material 40 filled in the through holes 22 is exposed to the circuit principal surface 20a of the circuit substrate 20. The heat radiation material 40 is heat radiation grease having an insulating property and a curability. For example, the heat radiation material 40 is gradually cured by absorbing moisture in the air. The heat radiation material 40 described above is an example and may be changed as appropriate depending on product specifications.

As illustrated in FIG. 1, the heat radiation material 40 exposed to the circuit principal surface 20a covers the distal ends of a plurality of arbitrary connection terminals 13 located in the vicinity of the through hole 22 among the connection terminals 13 of the heating element 10 that are fixed with the solder 14. Specifically, the heat radiation material 40 is applied so as to further cover the solder 14 that covers the connection terminals 13.

Next, a method for assembling the electronic control device 1 is described.

First, the connection terminals 13 of the heating element 10 are fixed to the wiring patterns 21 on the circuit principal surface 20a of the circuit substrate 20 with the solder 14. Next, a predetermined amount of the heat radiation material 40 is applied to the surface of the heat radiation plate 30. Then, the circuit principal surface 20b of the circuit substrate 20 and the surface of the heat radiation plate 30 where the heat radiation material 40 is applied are caused to face each other. The circuit principal surface 20b and the surface of the heat radiation plate 30 where the heat radiation material 40 is applied are brought closer to each other. The heat radiation material 40 receives pressing forces in an assembling direction from both of the circuit substrate 20 and the heat radiation plate 30 to spread all over the circuit principal surface 20b and the surface of the heat radiation plate 30. The heat radiation material 40 enters and fills the through holes 22 provided in the circuit substrate 20 by the pressing forces received from both of the circuit substrate 20 and the heat radiation plate 30. When the heat radiation material 40 is filled in the through holes 22 and is exposed to the circuit principal surface 20a of the circuit substrate 20, the circuit principal surface 20b and the surface of the heat radiation plate 30 where the heat radiation material 40 is applied are no longer brought closer to each other. Lastly, the uncured heat radiation material 40 exposed to the circuit principal surface 20a is applied so as to further cover the solder 14 that covers the connection terminals 13. When the heat radiation material 40 is sufficiently cured by absorbing moisture in the air, the assembling of the electronic control device 1 is completed.

As described above in detail, the electronic control device 1 according to this embodiment attains the following actions and effects.

(1) The cylindrical through holes 22 passing through the circuit substrate 20 in its thickness direction are provided in the circuit substrate 20 at positions spaced away from the distal ends of the connection terminals 13 of the heating element 10 (peripheral edges of the heating element 10). Therefore, the condition of the heat radiation material 40 applied between the circuit principal surface 20b of the circuit substrate 20 and the heat radiation plate 30 can be checked via the through holes 22.

(2) The conductive plating 22a provided on the inner peripheral surface of the through hole 22 is in contact with arbitrary wiring patterns 21 of the first to fourth circuit conductor layers 20c to 20f of the circuit substrate 20. Therefore, heat generated from the heating element 10 is transferred to the connection terminals 13, and is further transferred from the connection terminals 13 to the heat radiation material 40 filled in the through hole 22 via the wiring patterns 21 of the circuit substrate 20. Thus, the heat radiation effect for the heat generated from the heating element 10 can further be improved.

(3) The heat radiation material 40 is exposed to the circuit principal surface 20a of the circuit substrate 20 via the through holes 22. The exposure of the heat radiation material 40 to the circuit principal surface 20a of the circuit substrate 20 via the through holes 22 indicates that the heat radiation material 40 is sufficiently applied between the circuit substrate 20 and the heat radiation plate 30. Therefore, it is only necessary to check that the heat radiation material 40 is exposed to the circuit principal surface 20a. Thus, it is possible to check more easily that the heat radiation material 40 is appropriately applied between the circuit principal surface 20b of the circuit substrate 20 and the heat radiation plate 30.

(4) At least a part of the connection terminals 13 of the heating element 10 is covered with the heat radiation material 40 exposed to the circuit principal surface 20a of the circuit substrate 20. Therefore, the heat generated from the heating element 10 is directly transferred to the heat radiation material 40. Thus, the heat radiation effect for the heat generated from the heating element 10 can further be improved.

(5) The heat radiation material 40 is the heat radiation grease having the curability and the insulating property. The connection terminals 13 of the heating element 10 that are connected to the wiring patterns 21 with the solder 14 are covered with the heat radiation material 40 that has the curability and is exposed to the circuit principal surface 20a of the circuit substrate 20. Therefore, the maintainability of connection of the connection terminals 13 of the heating element 10 to the wiring patterns 21 can be improved. The heat radiation material 40 has the insulating property, and therefore the insulation between the adjacent connection terminals 13 can also be improved in a state in which the connection terminals 13 and the wiring patterns 21 are connected to each other.

(6) In general, it is known that heat is radially transferred from a heat source. Therefore, the through holes 22 are provided in the circuit substrate 20 along the entire periphery of the heating element 10. Thus, the heat generated from the heating element 10 can be radiated more effectively.

(7) The through holes 22 are provided away from the distal ends of the connection terminals 13 of the heating element 10 by the distance T2 equal to or smaller than the substrate thickness T1. Therefore, a path along which the heat generated from the heating element 10 is transferred from the circuit principal surface 20a of the circuit substrate 20 to the heat radiation plate 30 via the heat radiation material 40 filled in the through holes 22 can be used as a heat transfer path in addition to a path along which the heat generated from the heating element 10 is transferred from the circuit principal surface 20a of the circuit substrate 20 to the circuit principal surface 20b of the circuit substrate 20 and is further transferred to the heat radiation plate 30 via the heat radiation material 40. That is, the heat radiation effect for the heating element 10 can be improved.

An electronic control device according to a second embodiment is described below. The electronic control device of this embodiment is different from the electronic control device of the first embodiment in that a heat radiation plate other than the heat radiation plate 30 is provided. Therefore, components similar to those of the first embodiment are represented by the same reference symbols to omit detailed description of the components.

As illustrated in FIG. 3, a heat radiation plate 50 serving as a first heat radiator is provided on a surface of the heating element 10 that is opposite to the circuit substrate 20. The heat radiation plate 50 is provided through intermediation of a heat radiation material 45 serving as a second heat radiator.

The heat radiation plate 50 has principal surfaces 50a and 50b. The principal surface 50a is a surface of the heat radiation plate 50 that is opposite to the circuit substrate 20, and the principal surface 50b is a surface of the heat radiation plate 50 that faces the circuit substrate 20. The heat radiation plate 50 employed herein has a rectangular shape and has a slightly larger size than that of the heat radiation plate 30. The heat radiation plate 50 is provided so as to cover the heating element 10. A part of the heat radiation plate 50 other than the part where the heating element 10 is provided faces the circuit substrate 20 with a clearance therebetween. The shape of the heat radiation plate 50 is not limited to the rectangular shape, and may be changed as appropriate as long as the heat radiation plate 50 has a shape and size capable of covering the heating element 10.

The heat radiation plate 50 has a plurality of cylindrical through holes 51. The through holes 51 are provided within a range of a part of the heat radiation plate 50 that faces a surface 10a of the heating element 10 that is opposite to the circuit substrate 20. The through hole 51 passes through the heat radiation plate 50 in its thickness direction. The through hole 51 is open to each of the principal surface 50a and the principal surface 50b of the heat radiation plate 50.

The heat radiation material 45 is applied between the surface 10a of the heating element 10 and the heat radiation plate 50. Further, the heat radiation material 45 is filled in the through holes 51. The heat radiation material 45 filled in the through holes 51 is exposed to the principal surface 50a of the heat radiation plate 50. The heat radiation material 45 is the same as the heat radiation material 40 interposed between the circuit principal surface 20b of the circuit substrate 20 and the heat radiation plate 30.

Next, a method for assembling the electronic control device 1 is described. The heating element 10, the circuit substrate 20, and the heat radiation plate 30 are assembled similarly to the first embodiment.

After the heating element 10, the circuit substrate 20, and the heat radiation plate 30 are assembled and the condition of the applied heat radiation material 40 is checked, a predetermined amount of the heat radiation material 45 is applied to the surface 10a of the heating element 10. Then, the surface 10a of the heating element 10 and the principal surface 50b of the heat radiation plate 50 are brought closer to each other in a state in which the surface 10a and the principal surface 50b are caused to face each other. The heat radiation material 45 receives pressing forces in an assembling direction from both of the heating element 10 and the heat radiation plate 50 to spread all over the space between the surface 10a and a part of the principal surface 50b that faces the surface 10a. The heat radiation material 45 enters and fills the through holes 51 of the heat radiation plate 50 by the pressing forces received from both of the heating element 10 and the heat radiation plate 50. When the heat radiation material 45 is filled in the through holes 51 and is exposed to the principal surface 50a of the heat radiation plate 50, the surface 10a and the principal surface 50b are no longer brought closer to each other. Lastly, when the heat radiation material 45 is sufficiently cured by absorbing moisture in the air, the assembling of the electronic control device 1 is completed.

According to this embodiment, the following effects are attained in addition to the effects (1) to (6) of the first embodiment. That is, the condition of the heat radiation material 45 interposed between the surface 10a of the heating element 10 and the principal surface 50b of the heat radiation plate 50 can be checked via the through holes 51. Further, the heat radiation material 45 has a curability. Therefore, the adhesion between the heating element 10 and the heat radiation plate 50 is improved such that the heat radiation material 45 enters the through holes 51 and is cured (anchor effect).

The first embodiment and the second embodiment may be modified as follows without technical contradiction.

In the first and second embodiments, the heat radiation materials 40 and 45 are exposed to the circuit principal surface 20a of the circuit substrate 20 and the principal surface 50a of the heat radiation plate 50 via the through holes 22 and 51, respectively. However, the heat radiation materials 40 and 45 need not be exposed to the circuit principal surface 20a and the principal surface 50a, respectively. For example, the heat radiation materials 40 and 45 may be filled to the middle of the through holes 22 and 51, respectively. It is possible to check that the heat radiation material 40 is appropriately applied between the circuit substrate 20 and the heat radiation plate 30 and that the heat radiation material 45 is appropriately applied between the heating element 10 and the heat radiation plate 50 based on the conditions that the heat radiation materials 40 and 45 enter the through holes 22 and 51, respectively.

In the first and second embodiments, the circuit substrate 20 has eight through holes 22, but the present invention is not limited thereto. For example, the number of through holes 22 may be set to more than eight. With this setting, the heat radiation effect for the heat generated from the heating element 10 can be improved. Further, the number of through holes 22 may be set to less than eight. In this case, it is effective to provide the through holes 22 at positions corresponding to at least the respective sides of the heating element 10. However, the positions of the through holes 22 may be changed as appropriate depending on product specifications. For example, the through holes 22 may be provided at positions corresponding to a part of the sides of the heating element 10 instead of all the sides.

In the second embodiment, the heat radiation plate 50 has the plurality of through holes 51, but may only have one through hole 51. Also in this case, the condition of the heat radiation material 45 interposed between the heating element 10 and the heat radiation plate 50 can be checked.

In the first and second embodiments, the through holes 22 are provided away from the peripheral edges of the heating element 10 by the distance T2 equal to or smaller than the thickness T1 of the circuit substrate 20, but the present invention is not limited thereto. For example, the through holes 22 may be provided away from the peripheral edges of the heating element 10 by a distance larger than the thickness T1 of the circuit substrate 20. In this case, the through holes 22 are provided within a range in which the heat radiation material 40 is applied between the circuit principal surface 20b of the circuit substrate 20 and the heat radiation plate 30.

In the first and second embodiments, the through hole 22 is in contact with the wiring patterns 21 via the conductive plating 22a, but the present invention is not limited thereto. For example, the conductive plating 22a may be omitted. In this case, it is only necessary that the heat radiation material 40 filled in the through hole 22 and the wiring patterns 21 be in contact with each other. As another example, the wiring patterns 21 may pass through the conductive plating 22a.

In the first and second embodiments, the heat radiation material 40 exposed to the circuit principal surface 20a is applied so as to cover the distal ends of arbitrary connection terminals 13 among the connection terminals 13 of the heating element 10 that are fixed with the solder 14, but the present invention is not limited thereto. For example, the heat radiation material 40 may be applied so as to cover the distal ends of all the connection terminals 13.

In the first and second embodiments, the heat radiation material 40 is applied so as to cover the solder 14, but the present invention is not limited thereto. For example, the heat radiation material 40 may be applied so as to fill a clearance between the adjacent connection terminals 13 (pieces of solder 14). Also in this case, the insulation between the adjacent connection terminals 13 can be secured and the maintainability of connection of the connection terminals 13 to the wiring patterns 21 can be improved. At least the maintainability of connection of the connection terminals 13 to the wiring patterns 21 can be improved by applying the heat radiation material 40 so as to cover at least a part of the connection terminals 13.

In the first and second embodiments, the heat radiation materials 40 and 45 have the property in which the heat radiation materials 40 and 45 are gradually cured by absorbing moisture in the air, but the present invention is not limited thereto. For example, the heat radiation materials 40 and 45 may be of a type in which the heat radiation materials 40 and 45 are cured by being left to stand at normal temperature. The heat radiation materials 40 and 45 may be two-part curable grease. Also with this structure, in the first embodiment, the maintainability of the connection of the connection terminals 13 to the wiring patterns 21 can be improved by covering a part of the connection terminals 13 with the heat radiation material 40. In the second embodiment, the adhesion between the heating element 10 and the heat radiation plate 50 can be improved by the anchor effect.

In the first and second embodiments, the circuit substrate 20 has the multilayer structure in which the first to fourth circuit conductor layers 20c to 20f are laminated with the first to third insulating layers 20g to 20i respectively interposed therebetween, but the present invention is not limited thereto. For example, the circuit substrate 20 may have a single-layer structure.

In the first and second embodiments, the heat radiation plate 30 is in contact with the circuit substrate 20 via the heat radiation material 40, but the present invention is not limited thereto. For example, the size of the heat radiation plate 30 may be set substantially equal to the size of the circuit substrate 20 and the heat radiation plate 30 and the circuit substrate 20 may be in contact with each other on their peripheral edges. In this case, the circuit substrate 20 and the heat radiation plate 30 may be fixed to each other with bolts or the like at their contact positions.

In the first and second embodiments, the heat radiation materials 40 and 45 used herein have the curability and the insulating property, but the present invention is not limited thereto. For example, the heat radiation materials 40 and 45 need not have the curability. The heat radiation materials 40 and 45 may be heat radiation grease that is constantly in a paste form. In this case, it is only necessary that the circuit substrate 20 and the heat radiation plate 30 be fixed to each other with bolts or the like and that the circuit substrate 20 and the heat radiation plate 50 be fixed to each other with bolts or the like. As another example, the heat radiation materials 40 and 45 need not have the insulating property when the heat radiation materials 40 and 45 are applied to portions of the heating element 10 where the insulating property is not required.

In the second embodiment, the heat radiation material 40 is interposed between the circuit substrate 20 and the heat radiation plate 30 and the heat radiation material 45 is applied between the heating element 10 and the heat radiation plate 50, but the present invention is not limited thereto. For example, the heat radiation material 40 need not be interposed between the circuit substrate 20 and the heat radiation plate 30. In this case, only the heat radiation material 45 may be applied between the heating element 10 and the heat radiation plate 50 while the heat radiation plate 30 is omitted.

The heat radiation plates 30 and 50 have the rectangular plate shape, but only need to have a structure in which the heat radiation materials 40 and 45 can be interposed between the heat radiation plate 30 and the circuit substrate 20 and between the heat radiation plate 50 and the heating element 10, respectively. In this case, it is appropriate that the conditions of the heat radiation materials 40 and 45 can be checked via the through holes 22 and 51, respectively.

What is claimed is:

1. An electronic control device, comprising:
a substrate provided with a heating element on a first surface of the substrate;
a second heat radiator provided on a second surface of the substrate that is opposite to the first surface of the substrate; and
a first heat radiator provided such that the second heat radiator is interposed between the first heat radiator and the second surface of the substrate, wherein the substrate includes a through hole that passes through the substrate in its a thickness direction of the substrate and is provided away from peripheral edges of the heating element at a position where the second heat radiator is interposed, the heating element includes a plurality of terminals on the peripheral edges of the heating element, and a part of the terminals is covered with the second heat radiator exposed to the first surface of the substrate.

2. The electronic control device according to claim 1, wherein the substrate includes substrate electrodes, the terminals are connected to the substrate electrodes with solder, and a part of the substrate electrodes is exposed to an inside of the through hole of the substrate.

3. The electronic control device according to claim 1, wherein the second heat radiator is exposed to the first surface of the substrate via the through hole provided in the substrate.

4. The electronic control device according to claim 3, wherein the terminals are connected, with solder, to substrate electrodes provided on the first surface of the substrate.

5. The electronic control device according to claim 4, wherein the second heat radiator has a curability and an insulating property.

\* \* \* \* \*